United States Patent
Krawinkel

(10) Patent No.: US 9,273,231 B2
(45) Date of Patent: Mar. 1, 2016

(54) HEAT-ACTIVABLE ADHESIVE TAPE PARTICULARLY FOR BONDING ELECTRONIC COMPONENTS AND CONDUCTOR TRACKS

(75) Inventor: Thorsten Krawinkel, Hamburg (DE)

(73) Assignee: tesa SE, Norderstedt (DE)

( * ) Notice: Subject to any disclaimer, the term of this patent is extended or adjusted under 35 U.S.C. 154(b) by 620 days.

(21) Appl. No.: 12/440,276

(22) PCT Filed: Sep. 24, 2007

(86) PCT No.: PCT/EP2007/060096
§ 371 (c)(1),
(2), (4) Date: May 13, 2009

(87) PCT Pub. No.: WO2008/043660
PCT Pub. Date: Apr. 17, 2008

(65) Prior Publication Data
US 2010/0012271 A1    Jan. 21, 2010

(30) Foreign Application Priority Data

Oct. 6, 2006 (DE) .......................... 10 2006 047 738

(51) Int. Cl.
| | | |
|---|---|---|
| *C09J 7/00* | (2006.01) | |
| *C09J 5/06* | (2006.01) | |
| *C09J 153/02* | (2006.01) | |
| *C09J 163/00* | (2006.01) | |
| *C08L 53/02* | (2006.01) | |
| *C08L 63/00* | (2006.01) | |
| *C08J 5/12* | (2006.01) | |
| *C09J 7/02* | (2006.01) | |
| *C08K 3/00* | (2006.01) | |
| *C08L 53/00* | (2006.01) | |
| *H05K 3/38* | (2006.01) | |

(52) U.S. Cl.
CPC .. *C09J 7/00* (2013.01); *C08J 5/128* (2013.01); *C08K 3/0083* (2013.01); *C08K 3/0091* (2013.01); *C09J 5/06* (2013.01); *C09J 7/0203* (2013.01); *C09J 153/025* (2013.01); *C09J 163/00* (2013.01); *C08J 2379/08* (2013.01); *C08K 3/0016* (2013.01); *C08L 53/00* (2013.01); *C08L 63/00* (2013.01); *C09J 2453/00* (2013.01); *C09J 2479/086* (2013.01); *H05K 3/386* (2013.01); *Y10T 428/287* (2015.01); *Y10T 428/2813* (2015.01); *Y10T 428/2883* (2015.01)

(58) Field of Classification Search
None
See application file for complete search history.

(56) References Cited

U.S. PATENT DOCUMENTS

| | | | |
|---|---|---|---|
| 3,769,254 A | 10/1973 | Anderson et al. | |
| 3,970,608 A | 7/1976 | Furukawa et al. | |
| 4,005,247 A | 1/1977 | Graham | |
| 4,460,239 A | 7/1984 | Inoue | |
| 5,369,167 A | 11/1994 | Pottick et al. | |
| 6,353,066 B1 * | 3/2002 | Sosa | 526/224 |
| 7,429,419 B2 | 9/2008 | Ring et al. | |
| 2004/0159969 A1 | 8/2004 | Truog et al. | |
| 2005/0090592 A1 * | 4/2005 | Husemann et al. | 524/322 |
| 2005/0287363 A1 | 12/2005 | Ring et al. | |
| 2005/0288436 A1 | 12/2005 | Ring et al. | |
| 2007/0218276 A1 * | 9/2007 | Hiramatsu et al. | 428/354 |
| 2007/0270553 A1 * | 11/2007 | Bohm et al. | 525/314 |
| 2007/0275240 A1 | 11/2007 | Krawinkel | |
| 2008/0271845 A1 * | 11/2008 | Keite-Telgenbuscher | C09J 7/0242 156/307.1 |

FOREIGN PATENT DOCUMENTS

| | | |
|---|---|---|
| DE | 10361540 A1 | 7/2005 |
| DE | 102004007258 A1 | 7/2005 |
| DE | 102004031188 A1 | 1/2006 |
| DE | 102005055769 A1 | 5/2007 |
| EP | 1311559 A2 | 5/2003 |
| EP | 1612251 A1 | 1/2006 |
| EP | 1612253 A1 | 1/2006 |
| JP | 57149369 A | 9/1982 |
| JP | 2003-535189 A | 11/2003 |
| JP | 2004-505166 A | 2/2004 |
| WO | WO 0192344 A2 * | 12/2001 |
| WO | 2004074386 A2 | 9/2004 |
| WO | 2007025007 A1 | 3/2007 |
| WO | WO 2007/057318 A1 * | 5/2007 ................ C09J 7/02 |

OTHER PUBLICATIONS

Korean Examination Report dated Dec. 17, 2013.

* cited by examiner

*Primary Examiner* — Frank D Ducheneaux
(74) *Attorney, Agent, or Firm* — Norris McLaughlin & Marcus PA

(57) ABSTRACT

Heat activable adhesive tape for bonding electronic components and conductor tracks, with an adhesive composition having at least an acid-modified or acid anhydride-modified vinylaromatic block copolymer, and epoxide compound and a metal chelate.

12 Claims, No Drawings

HEAT-ACTIVABLE ADHESIVE TAPE PARTICULARLY FOR BONDING ELECTRONIC COMPONENTS AND CONDUCTOR TRACKS

This is a 371 of PCT/EP2007/060096 filed 24 Sep. 2007 (international filing date).

The invention relates to a heat-activable adhesive of low fluidity at high temperatures particularly for bonding flexible printed conductor tracks (flexible printed circuit boards, FPCBs).

BACKGROUND OF THE INVENTION

Flexible printed circuit boards are nowadays employed in a multiplicity of electronic devices such as mobile phones, radios, computers, printers and many more. They are constructed from layers of copper and a high-melting resistant thermoplastic: mostly polyimide, less often polyester. These FPCBs are frequently produced using adhesive tapes with particularly exacting requirements. On the one hand, for producing the FPCBs, the copper foils are bonded to the polyimide sheets; on the other hand, individual FPCBs are also bonded to one another, in which case polyimide bonds to polyimide. In addition to these applications, the FPCBs are also bonded to other substrates.

The adhesive tapes used for these bonding tasks are subject to very exacting requirements. Since very high bond performances must be attained, the adhesive tapes used are generally heat-activable tapes, which are processed at high temperatures. These adhesive tapes must not emit volatile constituents in the course of this high temperature load during the bonding of the FPCBs, which often takes place at temperatures around 200° C. In order to achieve a high level of cohesion the adhesive tapes ought to crosslink during this temperature load. High pressures during the bonding operation make it necessary for the flowability of the adhesive tapes at high temperatures to be low. This is achieved by high viscosity in the uncrosslinked adhesive tape or by very rapid crosslinking. Moreover, the adhesive tapes must also be solder bath resistant, in other words must for a short time withstand a temperature load of 288° C.

For this reason the use of pure thermoplastics is not rational, despite the fact that they melt very readily, ensure effective wetting of the bond substrates and lead to very rapid bonding within a few seconds. At high temperatures, though, they are so soft that they tend to swell out of the bondline under pressure in the course of bonding. Accordingly there is no solder bath resistance either.

For crosslinkable adhesive tapes it is usual to use epoxy resins or phenolic resins, which react with specific hardeners to form polymeric networks. In this specific case the phenolic resins cannot be used, since in the course of crosslinking they generate elimination products, which are released and, in the course of curing or, at the latest, in the solder bath, lead to blistering.

Epoxy resins are employed primarily in structural adhesive bonding and, after curing with appropriate crosslinkers, produce very brittle adhesives, which indeed achieve high bond strengths but possess virtually no flexibility.

Increasing the flexibility is vital for use in FPCBs. On the one hand the bond is to be made using an adhesive tape which ideally is wound onto a roll; on the other hand the conductor tracks in question are flexible, and must also be bent, readily apparent from the example of the conductor tracks in a laptop, where the foldable screen is connected via FPCBs to the further circuits.

Flexibilizing these epoxy resin adhesives is possible in two ways. First, there exist epoxy resins flexibilized with elastomer chains, but the flexibilization they experience is limited, owing to the very short elastomer chains. The other possibility is to achieve flexibilization through the addition of elastomers, which are added to the adhesive. This version has the drawback that the elastomers are not crosslinked chemically, meaning that the only elastomers that can be used are those which at high temperatures still retain a high viscosity.

Because the adhesive tapes are produced generally from solution it is frequently difficult to find elastomers of a sufficiently long-chain nature not to flow at high temperatures while being still of a sufficiently short-chain nature that they can be brought into solution.

Production via a hotmelt operation is possible but very difficult in the case of crosslinking systems, since it is necessary to prevent premature crosslinking during the production operation.

In many applications in the field of the production and processing of FPCBs, the adhesive tapes are removed from the release medium that normally protects the adhesive tapes, and then are positioned on the substrates to be bonded. In this case it is necessary to ensure that the adhesive tapes, which prior to this operation have frequently already been die-cut, are not deformed either during the removal of the release medium or during positioning. Since removal of the release medium requires a certain force to be expended, the modulus of elasticity of the adhesive tapes must be high enough not to experience any stretching or other deformation as a result of this force. Given that the products used must be as thin as possible, it is difficult to incorporate a carrier into the adhesive tape; instead, in general, the adhesive tape is composed only of one layer of adhesive. This adhesive, therefore, must have a sufficiently high modulus of elasticity not to be stretched.

Adhesives based on acid anhydride-modified block copolymers and epoxy resins are known from U.S. Pat. No. 5,369,167 A. A method of producing these compounded formulations is described. Moreover, curing agents are used for crosslinking the epoxy resin. There is no mention of an adhesive tape.

Similar adhesives are described in JP 57/149369 A1 as well. Again, a curing agent is needed for the epoxy resin. An adhesive tape is not disclosed.

The crosslinking of maleic anhydride-modified block copolymers with chelates is known from EP 1 311 559 A2, where an increase in the cohesion of the block copolymer mixtures is described. A way of producing heat-activable adhesive tapes which in spite of the chelate crosslinking enter at high temperatures into a crosslinking with epoxy resins is not mentioned.

Furthermore, chelate crosslinking with, for example, acid-modified acrylate adhesives is known, for example from U.S. Pat. No. 4,005,247 A or U.S. Pat. No. 3,769,254 A.

DE 10 2004 031 188 A1 discloses an adhesive tape for bonding electronic components and flexible conductor tracks, comprising an adhesive composed at least of an acid-modified or acid anhydride-modified vinylaromatic block copolymer and an epoxy resin. Metal chelates are not mentioned.

DE 10 2004 007 258 A1 discloses an adhesive for an adhesive sheet strip, comprising a mixture of an acid-modified or acid anhydride-modified vinylaromatic block copolymer, a metal chelate of the following formula:

$$(R_1O)_nM(XR_2Y)_m,$$

where
- M is a metal from main group 2, 3, 4 or 5 or a transition metal;
- $R_1$ is an alkyl or aryl group;
- n is zero or a larger integer,
- X and Y are oxygen or nitrogen, and in each case may also be attached at $R_2$ by a double bond;
- $R_2$ is an alkylene group which connects X and Y and which may be branched, or else may contain oxygen or further heteroatoms in the chain;
- m is an integer, but is at least 1, and a tackifier resin,
the adhesive sheet strips being detachable by extensive stretching in the direction of the bondline.

The addition of epoxide-containing compounds is not described.

It is an object of the invention to provide an adhesive tape which is heat-activable, crosslinks in the heat, possesses a low viscosity in the heat, displays effective adhesion to polyimide, in the uncrosslinked state is soluble in organic solvents and has a high modulus of elasticity at room temperature.

SUMMARY OF THE INVENTION

A heat-activable adhesive particularly for bonding electronic components and conductor tracks, with an adhesive composed at least of
a) an acid-modified or acid anhydride-modified vinylaromatic block copolymer,
b) an epoxide-containing compound and
c) a metal chelate.

The general expression "adhesive tape" for the purposes of this invention embraces all sheetlike structures, such as two-dimensionally extended sheets or sheet sections, tapes with extended length and limited width, tape sections, diecuts and the like.

Adhesives employed are preferably those based on block copolymers comprising polymer blocks predominantly formed of vinylaromatics (A blocks), preferably styrene, and those predominantly formed by polymerization of 1,3-dienes (B blocks), preferably butadiene and isoprene. Both homopolymer and copolymer blocks can be utilized in accordance with the invention. Resulting block copolymers may contain alike or different B blocks, which may be partly, selectively or completely hydrogenated. Block copolymers may have a linear A-B-A structure. Likewise useful are block copolymers of radial design, and also star-shaped and linear multiblock copolymers. Further components present may include A-B diblock copolymers. Block copolymers of vinylaromatics and isobutylene are likewise useful in accordance with the invention. All of the aforementioned polymers may be used alone or in a mixture with one another.

At least some of the block copolymers used must be acid-modified or acid anhydride-modified, the modification taking place principally by free-radical graft copolymerization of unsaturated monocarboxylic and polycarboxylic acids or anhydrides, such as, for example, fumaric acid, itaconic acid, citraconic acid, acrylic acid, maleic anhydride, itaconic anhydride or citraconic anhydride, preferably maleic anhydride. The fraction of acid or acid anhydride is preferably between 0.5 and 4 percent by weight, based on the block copolymer as a whole.

Commercially, block copolymers of this kind are available, for example, under the name Kraton™ FG 1901 and Kraton™ FG 1924 from Shell, or Tuftec™ M 1913 and Tuftec™ M 1943 from Asahi.

Epoxy resins are usually understood to be not only monomeric but also oligomeric compounds containing more than one epoxide group per molecule. They may be reaction products of glycidyl esters or epichlorohydrin with bisphenol A or bisphenol F or mixtures of these two. Likewise suitable for use are epoxy novolak resins, obtained by reacting epichlorohydrin with the reaction product of phenols and formaldehyde. Monomeric compounds containing two or more epoxide end groups, used as diluents for epoxy resins, can also be employed. Likewise suitable for use are elastically modified epoxy resins or epoxide-modified elastomers such as, for example, epoxidized styrene block copolymers, an example being Epofriend from Daicel.

DETAILED DESCRIPTION

Examples of epoxy resins are ARALDITE™ 6010, CY-281™, ECN™ 1273, ECN™ 1280, MY 720, RD-2 from Ciba Geigy, DER™ 331, 732, 736, DEN™ 432 from Dow Chemicals, Epon™ 812, 825, 826, 828, 830 etc. from Shell Chemicals, HPT™ 1071, 1079, likewise from Shell Chemicals, and BAKELITE™ EPR 161, 166, 172, 191, 194 etc. from Bakelite AG.

Commercial aliphatic epoxy resins are, for example, vinylcyclohexane dioxides such as ERL-4206, 4221, 4201, 4289 or 0400 from Union Carbide Corp.

Elasticized elastomers are available from Noveon under the name Hycar.

Epoxy diluents, monomeric compounds containing two or more epoxide groups, are for example BAKELITE™ EPD KR, EPD Z8, EPD HD, EPD WF, etc. from Bakelite AG or POLYPDX™ R 9, R12, R 15, R 19, R 20 etc. from UCCP.

Although, as described above, the addition of crosslinkers is not necessary, it is nevertheless possible for further curing agents to be added. Curing agents used here should only be substances having acid groups or acid anhydride groups, since the amines and guanidines employed principally for epoxide crosslinking react with the acid anhydride and hence lower the number of reactive groups.

Besides the acid-modified or acid anhydride-modified vinylaromatic block copolymers already mentioned, it is also possible to add further acids or acid anhydrides in order to achieve a higher degree of crosslinking and hence an even further-improved cohesion. In this context it is possible to use monomeric acid anhydrides and acids, as described in U.S. Pat. No. 3,970,608 A, acid-modified or acid anhydride-modified polymers, and also acid anhydride copolymers such as polyvinyl methyl ether-maleic anhydride copolymers, purchasable for example under the name Gantrez™, sold by the company ISP.

The metals of metal chelates may be those of main groups 2, 3, 4 and 5 and the transition metals. Particularly suitability is possessed for example by aluminium, tin, titanium, zirconium, hafnium, vanadium, niobium, chromium, manganese, iron, cobalt and cerium. Aluminium and titanium are particularly preferred.

Various metal chelates can be employed for the chelate crosslinking, and can be represented by the following formula:

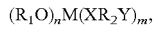

where
- M is a metal as described above,
- $R_1$ is an alkyl or aryl group such as methyl, ethyl, butyl, isopropyl or benzyl, n is zero or a larger integer, X and Y are oxygen or nitrogen, which in each case may also be attached to $R_2$ by a double bond, $R_2$ is an alkylene group which connects X and Y and which may be branched, or else may contain oxygen or further heteroatoms in the chain, m is an integer, but is at least 1.

Preferred chelate ligands are those resulting from the reaction of the following compounds: triethanolamine, 2,4-pentanedione, 2-ethyl-1,3-hexanediol or lactic acid. Particularly preferred crosslinkers are aluminium acetylacetonates and titanyl acetylacetonates.

The chosen ratio between the acid and/or acid anhydride groups and the acetylacetonate groups ought to be approximately equivalent in order to achieve optimum crosslinking, with a small excess of crosslinker having been found to be positive.

The ratio between anhydride groups and acetylacetonate groups, however, can be varied, though for adequate crosslinking neither of the two groups ought to be present in more than a five-fold molar excess.

The chemical crosslinking of the epoxy resins with the elastomers produces very high strengths within the adhesive film. The bond strengths to the polyimide as well, however, are decidedly high.

In order to raise the adhesion it is also possible to add tackifier resins which are compatible with the elastomer block of the block copolymers.

Tackifiers which can be used in pressure-sensitive adhesives of the invention are, for example, unhydrogenated, partially hydrogenated or fully hydrogenated resins based on rosin and rosin derivatives, hydrogenated polymers of dicyclopentadiene, unhydrogenated, partially, selectively or fully hydrogenated hydrocarbon resins based on $C_5$, $C_5/C_9$ or $C_9$ monomer streams, polyterpene resins based on α-pinene and/or β-pinene and/or δ-limonene, hydrogenated polymers of preferably pure $C_8$ and $C_9$ aromatics. Aforementioned tackifier resins can be used either alone or in a mixture.

Further additives which can be used typically include:
primary antioxidants, such as sterically hindered phenols
secondary antioxidants, such as phosphites or thioethers
in-process stabilizers, such as C-radical scavengers
light stabilizers, such as UV absorbers or sterically hindered amines
processing assistants
endblock reinforcer resins
fillers, such as silicon dioxide, glass (ground or in the form of beads), aluminium oxides, zinc oxides, calcium carbonates, titanium dioxides, carbon blacks, metal powders, etc.
colour pigments and dyes and also optical brightener
if desired, further polymers, preferably elastomeric in nature.

An advantage of the systems of the invention is the very low softening temperature, a consequence of the softening point of the polystyrene in the endblocks of the block copolymers. Since in the course of the crosslinking reaction the elastomers are incorporated into a polymeric network, and this reaction is relatively quick at the high temperatures of up to 200° C. typically used for the bonding of FPCBs, there are no instances of emergence of the adhesive from the bond line. Through the addition of what are known as accelerators it is possible to raise the reaction rate further.

Examples of possible accelerators include the following:
tertiary amines such as benzyldimethylamine, dimethylaminomethylphenol, tris(dimethylaminomethyl)phenol
boron trihalide-amine complexes
substituted imidazoles
triphenylphosphine Ideally the acid-modified and/or acid anhydride-modified elastomers and epoxy resins are employed in a proportion such that the molar fraction of epoxide groups and anhydride groups is just equivalent. When using only slightly modified elastomers and when using low molecular mass epoxy resins having a low epoxide equivalent, the result is only very small amounts—below 10% by weight, based on the modified styrene block copolymer—of epoxy resin to be used.

However, the proportion between anhydride groups and epoxide groups can be varied within wide ranges, although for sufficient crosslinking neither of the two groups ought to be present in a molar equivalent excess of more than four times.

To produce the adhesive tape the constituents of the adhesive are advantageously dissolved in a suitable solvent, for example toluene or mixtures of naphtha 70/90 and acetone, and the solution is coated onto a flexible substrate provided with a release layer, such as a release paper or release film, for example, and the coating is dried, so that the composition can be easily removed again from the substrate. Following appropriate converting, diecuts, rolls or other shapes can be produced at room temperature. Corresponding shapes are then adhered, preferably at elevated temperature, to the substrate to be bonded, polyimide for example.

It is also possible to coat the adhesive directly onto a polyimide backing. Adhesive sheets of this kind can then be used for masking copper conductor tracks for FPCBs.

It is not necessary for the bonding operation to be a one-stage process. Instead, the adhesive tape can first be adhered to one of the two substrates by carrying out hot lamination. In the course of the actual hot bonding operation with the second substrate (second polyimide sheet or copper foil), the resin then fully or partly cures and the bondline attains the high bond strength.

The admixed epoxy resins should preferably not yet enter into any chemical reaction at the lamination temperature, but instead should react with the acid or acid anhydride groups only on hot bonding.

An advantage of the adhesive of the invention is that the elastomer is in fact chemically crosslinked with the resin; there is not necessarily any need to add a hardener for the epoxy resin, since the elastomer itself acts as hardener.

As a result of the crosslinking with the metal chelates that occurs in the course of drying as part of the preparation process, the adhesives of the invention are significantly stiffened—and the modulus of elasticity is increased.

Surprisingly, in spite of this crosslinking at room temperature, the heat activation, generally at temperatures of more than 150° C., leads to crosslinking of the modified elastomers and the epoxy resins, between the acid and/or acid anhydride groups of the elastomers and the metal chelates, resulting in a high level of cohesion and a high bond strength. The metal chelates do not interfere with this second crosslinking step.

EXAMPLES

The invention is described in more detail below by a number of examples, without restricting the invention in any way whatsoever.

Example 1

A mixture of 92.5 g of Kraton™ FG 1901 (maleic anhydride-modified styrene-ethylene/butylene-styrene block copolymer with 30% by weight of block polystyrene and about 2% by weight of maleic anhydride), 7.5 g of Bakelite™ EPR 191 (epoxy resin) and 2 g of aluminium acetylacetonate are dissolved in toluene and coated from solution onto a 1.5 g/m³ siliconized release paper, the coating being dried at 110° C. for 15 minutes. The thickness of the adhesive layer is 25 µm.

Example 2

A mixture of 87.4 g of Kraton™ FG 1901, 2.6 g of Bakelite™ EPR 161 (epoxy resin), 10 g of Regalite™ R 1100 (hydrogenated hydrocarbon resin having a softening point of about 100° C., from Eastman) and 1.5 g of aluminium acetylacetonate are dissolved in toluene and coated from solution onto a 1.5 g/m³ siliconized release paper, the coating being dried at 110° C. for 15 minutes. The thickness of the adhesive layer is 25 µm.

Comparative Example 3

A mixture of 92.5 g of Kraton™ FG 1901 (maleic anhydride-modified styrene-ethylene/butylene-styrene block copolymer with 30% by weight of block polystyrene and about 2% by weight of maleic anhydride) and 7.5 g of Bakelite™ EPR 191 (epoxy resin) are dissolved in toluene and coated from solution onto a 1.5 g/m³ siliconized release paper, the coating being dried at 110° C. for 15 minutes. The thickness of the adhesive layer is 25 µm.

Bonding of FPCBs with the Adhesive Tape Produced

Two FPCBs were bonded using in each case one of the adhesive tapes produced in accordance with Examples 1 to 3. For this purpose the adhesive tape was laminated onto the polyimide sheet of the polyimide/copper foil FPCB laminate at 100° C. Subsequently a second polyimide sheet of a further FPCB was bonded to the adhesive tape and the whole assembly is compressed in a heatable Bürkle press at 180° C. and a pressure of 1.3 MPa for 30 min.

Test Methods

The properties of the adhesive sheets produced in accordance with the examples specified above was investigated by the following test methods.

T-Peel Test with FPCB

Using a tensile testing machine from Zwick, the FPCB/adhesive tape/FPCB assemblies produced in accordance with the process described above were peeled from one another at an angle of 180° and with a rate of 50 mm/min, and the force required, in N/cm, was measured. The measurements were made at 20° C. and 50% relative humidity. Each measurement value was determined three times.

Force at 5% Elongation

Since, with such thin, highly flexible materials it is often difficult to determine the modulus of elasticity, a force at 5% elongation was measured instead. This was done by punching, from the adhesive, an adhesive strip 1 cm wide and 10 cm long, which was clamped into a tensile testing machine. The strip was then extended at a speed of 300 mm/min and the force at an elongation of 5% was recorded. The result is recorded in N/cm.

Solder Bath Resistance

The FPCB assemblies bonded in accordance with the process described above were laid for 10 seconds onto a solder bath which is at a temperature of 288° C. The bond was rated solder bath resistant if there is no formation of air bubbles which cause the polyimide sheet of the FPCB to inflate. The test was rated as failed if there was even slight formation of bubbles.

Temperature Stability

In analogy to the T-peel test described, one side of the FPCB assemblies produced in accordance with the process disclosed above was suspended, while on the other side a weight of 500 g was attached. The static peel test took place at 70° C. The parameter measured was the static peel travel in mm/h.

Results:

For adhesive assessment of the abovementioned examples the T-peel test was conducted first of all.

The results are given in Table 1.

TABLE 1

| | T-peel test [N/cm] |
|---|---|
| Example 1 | 8.6 |
| Example 2 | 14.8 |
| Example 3 | 9.7 |

As can be seen, similarly high bond strengths were achieved in Examples 1 and 3.

The temperature stability of the adhesive tapes was measured using the static peel test, whose values can be found in Table 2.

TABLE 2

| | Static T-peel test at 70° C. [mm/h] |
|---|---|
| Example 1 | 4 |
| Example 2 | 11 |
| Example 3 | 5 |

Here as well, there are no great differences between Examples 1 and 3; only the resin-blended product, Example 2, shows somewhat greater peeling.

The force at 5% elongation can be taken from Table 3.

TABLE 3

| | Force at 5% elongation [N/cm] |
|---|---|
| Example 1 | 1.4 |
| Example 2 | 1.2 |
| Example 3 | 0.6 |

The crosslinking with the chelates significantly increases the force needed to stretch the adhesive strips.

The solder bath test was passed by all three examples.

The invention claimed is:

1. Heat-activable adhesive tape with an adhesive composed at least of
   a) an acid-modified or acid anhydride-modified vinylaromatic block copolymer,
   b) an epoxide-containing compound and,
   c) a metal chelate as crosslinker,
said adhesive being crosslinkable in two separate crosslinking steps, one at room temperature and the second at a temperature above 150° C.

2. Heat-activable adhesive tape according to claim 1, wherein the vinylaromatic block copolymer is a styrene block copolymer.

3. Heat-activable adhesive tape according to claim 1 wherein the epoxide-containing compound is an epoxy resin, an epoxidized polymer or a combination thereof.

4. Heat-activable adhesive tape according to claim 1, wherein in the second crosslinking step the epoxide groups crosslink with the acid or acid anhydride groups of the vinylaromatic block copolymer.

5. Heat-activable adhesive tape according to claim 1, wherein the metal chelate is represented by the formula

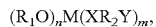

where
- M is a metal from main group 2, 3, 4 or 5, or a transition metal,
- $R_1$ is an alkyl or aryl group,
- n is zero or a larger integer,
- X and Y are oxygen or nitrogen, which in each case may also be attached to $R_2$ by a double bond,
- $R_2$ is an alkylene group which connects X and Y and which may be branched, or else may contain oxygen or further heteroatoms,
- m is an integer, but is at least 1.

6. Heat-activable adhesive tape according to claim 1, wherein the metal chelate is aluminium acetylacetonate or titanyl acetylacetonate.

7. Heat-activable adhesive tape according to claim 1, wherein the adhesive tape comprises further acid anhydrides, further elastomers, tackifying resins, accelerators, dyes, carbon black, metal powders or combinations thereof.

8. Heat-activable adhesive tape according to claim 1, wherein said acid-modified or acid anhydride-modified vinylaromatic block copolymer and said epoxide-containing compound are present in amounts whereby the amount of said epoxide-containing compound present is not more than 10% by weight of the amount of acid-modified or acid anhydride-modified elastomer present.

9. Method of adhesively bonding plastic parts, wherein said plastic parts are bonded with the heat-activable adhesive tape of claim 1, having an adhesive comprising at least the acid-modified or acid anhydride-modified vinylaromatic block copolymer and an epoxy resin as the epoxide-containing compound.

10. A method for bonding plastic parts which comprises bonding said plastic parts with the heat-activable adhesive tape of claim 1.

11. Method for bonding electronic components and/or flexible printed circuits (FPCBs) which comprises bonding said electronic components and/or flexible printed circuits with the heat-activable adhesive tape of claim 1.

12. Method for bonding an object to polyimide which comprises bonding said object to polyimide with the heat-activable adhesive tape of claim 1.

* * * * *